United States Patent [19]

Andricacos et al.

[11] Patent Number: 5,582,927
[45] Date of Patent: Dec. 10, 1996

[54] HIGH MAGNETIC MOMENT MATERIALS AND PROCESS FOR FABRICATION OF THIN FILM HEADS

[75] Inventors: Panayotis C. Andricacos, Croton-on-Hudson; Jei-Wei Chang, Tuckahoe; Wilma J. Horkans, Ossining; Judith D. Olsen, Owego; Bojan Petek, Croton-on-Hudson; Lubomyr T. Romankiw, Briarcliff Manor, all of N.Y.

[73] Assignee: International Business Machines Corporation, Armonk, N.Y.

[21] Appl. No.: 349,475

[22] Filed: Dec. 5, 1994

Related U.S. Application Data

[63] Continuation of Ser. No. 571,804, Aug. 23, 1990, abandoned.

[51] Int. Cl.$^6$ .................... G11B 5/66; C25D 5/18
[52] U.S. Cl. .................. 428/694 T; 428/694 TS; 428/694 TM; 428/655; 428/656; 428/674; 428/676; 428/675; 428/900; 205/50; 205/105; 205/176; 205/182; 205/238; 205/239; 205/255
[58] Field of Search ............... 428/694 T, 694 TM, 428/694 TS, 655, 656, 674, 676, 675, 900; 205/50, 105, 176, 182, 238, 239, 255

[56] References Cited

U.S. PATENT DOCUMENTS

| | | | |
|---|---|---|---|
| 3,408,522 | 11/1969 | Brownlow | 338/19 |
| 4,108,739 | 8/1978 | Tadokoro et al. | 205/176 |
| 4,652,348 | 3/1987 | Yahalom et al. | 205/104 |
| 4,756,816 | 7/1988 | Liao et al. | 205/50 |

FOREIGN PATENT DOCUMENTS

| | | |
|---|---|---|
| 1316483 | 4/1993 | Canada . |
| 0472031 | 2/1992 | European Pat. Off. . |
| 53-92497 | 8/1978 | Japan . |
| 59-41810 | 8/1984 | Japan . |

OTHER PUBLICATIONS

Digests of Intermag '86, Apr. 14–17, 1986, Phoenix, US, p. CC-6, IEEE; Y. Hoshi et al.: "Magnetic Properties of Fe–Co–M(M:Mn, V) lambda films by ion beam sputtering".

Extended Abstracts of the Electrochemical Society, vol. 89, p. 430, Abst. #300 (1989) L. T. Romankiw and J. D. Olsen "Electroplated Laminated Cu–Ni–Fe Films From A Single Plating For Inductive Recording Heads And Magnetic Shields".

IEEE Transactions on Magnectics, vol. 24, No. 3: 2045–2054 (May 1988) John C. Slonczewski et al. "Micromagnetics of Laminated Permalloy Films".

Metal Finishing, pp. 77–78 (Apr. 1968) R. Sivakumar and T. L. Rama Char "Deposition of Ternary Alloys—Nickel-Cobalt–Copper from Sulfate Baths".

Electroplating and Metal Finishing, pp. 44–49 (Feb. 1967) D. V. Subrahmanyam and T. L. Rama Char "Electrodeposition of Copper–Cobalt Alloys From The Pyrophosphate Bath".

Plating, pp. 619–625 (Jun. 1970) M. Sarojamma and T. L. Rama Char "Electrodepostion of Ternary Alloys of Cobalt–Nickel–Copper From The Pyrophosphate Bath".

Iron Steel Inst. (London), Rep. No. 14: 97–124 (1936) W. R. Maddocks and G. E. Claussen "Alloys of Iron–Copper–Carbon–Cobalt".

Arch. Eisenhutenw., 10: 115–118 (1936) W. Jellinghaus "The Iron–Cobalt–Copper System".

Primary Examiner—Leszek Kiliman
Attorney, Agent, or Firm—Scully, Scott, Murphy & Presser

[57] ABSTRACT

Certain alloys of CoFeCu are provided in film and laminate form which have a unique combination of electromagnetic properties which enable them to be used as magnetic thin films in magnetic recording heads, shields and flux guides. The films and laminates thereof are electrodeposited from a plating bath in a DC or pulsed current electrodeposition process.

54 Claims, 4 Drawing Sheets

HIGH MAGNETIC MOMENT MATERIALS AND PROCESS FOR FABRICATION OF THIN FILM HEADS

This is a continuation of application Ser. No. 07/571,804 filed on Aug. 23, 1990 now abandoned.

TECHNICAL FIELD

The present invention relates to certain alloys of cobalt, iron and copper (CoFeCu) which, in thin film form have a unique combination of electromagnetic properties which make them useful as magnetic thin films in magnetic recording heads, flux guides and shields. The present invention also relates to a novel plating process and plating bath wherewith the alloys can be prepared in thin film form.

BACKGROUND OF THE INVENTION

An ongoing demand for higher linear bit density in electronic computer disk storage systems has resulted in the use of magnetic storage media with increased coercivity. At the same time, the present trend towards faster electronic data transfer rates has required a steady increase in the high-frequency performance of the magnetic recording heads used in such media for such purposes.

Consequently, inductive or magnetic recording heads capable of producing a larger "write" field at a higher rate are constantly in need. To meet this need, it is necessary to provide magnetic thin-films having significantly higher magnetic moment values ($4\pi M_s$) than are available in the currently used thin-film materials. The most currently used magnetic thin film material is a nickel-iron alloy (NiFe), commonly known as Permalloy, which has a magnetic moment value of about 9,500 to 10,000 Gauss.

The use of magnetic thin films having higher magnetic moment values will result in two main advantages. The use of such materials in a recording head will enable the recording head to write onto recording media with a proportionally higher coercivity so that a higher linear density can also be achieved. Further, the use of such materials permits the use of thinner recording head pole tips thereby extending their frequency response inversely with the square of their thickness. The use of thinner magnetic films can also simplify the process of manufacturing them. Further, in applications where the magnetic recording head is also used to read the stored data, the use of increasingly narrow poletips for such applications (to achieve higher track density) necessitates the use of a magnetic thin film material having an intrinsic anisotropy value significantly higher than that of Permalloy, both to make the recording head device less sensitive to stress-induced anisotropy and to render the size of edge domains in the thin film materials considerably smaller than the size of the poletip itself. The intrinsic anisotropy value of Permalloy is about 3 to 6 Oe. Thinner poletips also provide higher resolution and less interference from adjacent bits during reading.

Prior Art

U.S. Pat. No. 3,480,522 (Brownlow) discloses magnetic thin films made from a laminate of a non-magnetic NiFe alloy which is rich in Cu and a magnetic NiFe alloy which has a low percentage of Cu.

U.S. Pat. No. 4,108,739 (Tadokoro et al.) discloses the formation, by electroplating, of thin film laminates of alternating layers of non-magnetic plated film and ferromagnetic plated film. The plating bath requires the presence of phosphorous which is incorporated into the alloy.

U.S. Pat. No. 4,652,348 (Yahalom et al.) discloses the preparation, by electrodeposition, of alloys having high elastic modulus and improved magnetic properties. Examples of the metals to be electrodeposited are copper-nickel; copper-palladium; nickel-gold; copper-nickel-iron and corresponding alloys with cobalt or iron relacing nickel. The CuNiCo alloys which are contemplated would apparently, however, have a relatively high Cu content. Further, the so-called alloys are apparently formed in such a way that each metal used is deposited separately in a substantially pure form, rather than as a true alloy of all of the metals used.

L. T. Romankiw et al. (*Extended Abstracts of the Electrochemical Society*, ABS #300, V. 89, pages 430–431, 1989) disclose the electroplating of laminated magnetic and non-magnetic CuNiFe films from a single plating solution for inductive recording heads and magnetic shields. The magnetic layer is about 5% Cu and the balance Ni and Fe in a 4:1 ratio. The non-magnetic layer consists of 95% Cu and 5% NiFe.

J. C. Slonczewski et al. (*IEEE Transactions on Magnetics*, vol. 24, No. 3, May 1988) disclose "Micromagnetics of Laminated Permalloy Films."

D. V. Subrahmanyam et al. (*Electroplating And Metal Finishing*,, February 1967, page 44) disclose the electrocodeposition of Cu and Co from a pyrophosphate bath.

M. Sarojamma et al. (*Plating*, June 1978, page 619) disclose the electrodeposition of CoNiCu alloys from a pyrophosphate bath.

U.S. Pat. No. 4,756,816 (Liao et al.) discloses the preparation of binary CoFe alloy films having a very high cobalt content.

OBJECTS OF THE INVENTION

An object of the present invention is to provide alloys of cobalt, iron and copper having a unique combination of electromagnetic properties in the form of thin film laminates with non-magnetic film laminae.

A further object of the present invention is to provide a magnetic thin film alloy of cobalt, iron and copper having a unique combination of electromagnetic properties.

A further object of the present invention is to provide such alloys which, in thin film laminate form, are useful as magnetic thin films in magnetic recording heads and shields.

A further object of the present invention is to provide novel magnetic recording heads employing such magnetic thin films.

A further object of the present invention is to provide novel electroplating baths and processes for producing such alloys and such thin film laminates.

SUMMARY OF THE INVENTION

The objects of the present invention are achieved by using the plating bath systems disclosed below to produce certain thin film alloys of cobalt, iron and copper which are DC plated, and thin film laminates of such alloys and other non-magnetic laminae which are plated by pulsed current.

DETAILED DESCRIPTION OF THE PREFERRED EMBODIMENT OF THE INVENTION

Figure 1:
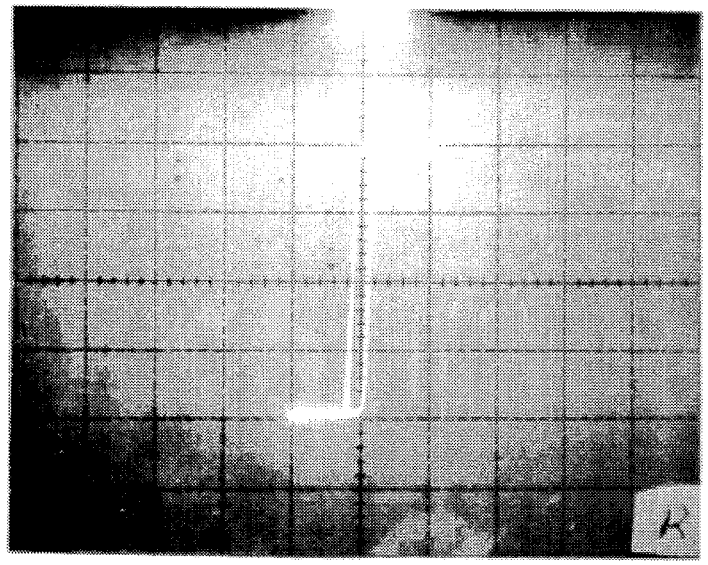
FIGS. 1 and 2 show B-H loops in the easy and hard axes, respectively, of a 2 µm $Ni_{82}Fe_{18}$ film.

The alloys of the present invention have the composition $Co_xFe_yCu_z$ wherein x, y and z represent the weight %, respectively, of the Co, Fe and Cu which is present in such alloys, and x is about 66 to 92, and preferably about 73 to 89, and most preferably about 74 to 87, y is about 6 to 14, and preferably about 8 to 13, and most preferably about 9 to 12, and z is about 2 to 20, and preferably about 3 to 14, and most preferably about 4 to 14.

The alloys may contain certain minor amounts of one or more of elemental oxygen, carbon and sulfur, or other components as long as they do not adversely affect the magnetic properties of the film (do not increase its coercivity, do not result in a loss in anisotropy or excessive loss of magnetic moment).

In non-laminated form the thickness of the alloys of the present invention is between about 500 and 50,000 Å.

In laminated form, the alloys are preferably prepared, for the purposes of the present invention, and as described in more detail below, in the form of magnetic layers which are each about 500 to 10,000 Angstrom units (Å) thick. They are also preferably formed, as disclosed below, in the form of laminates with non-magnetic laminae. The non-magnetic laminae are each about 5 to 500 Å thick and are composed of, as the non-magnetic materials, layers of copper alone, or layers of mostly copper with traces, of less than about 5 weight %, of cobalt.

The resulting laminates comprise n layers of the magnetic laminae and n-1 layers of non-magnetic laminae where n is an even number that ranges anywhere from 2 to 50. The laminates have a total thickness of about 0.1 to 5 microns.

The alloys of the present invention, in the form of a thin film of such alloy have the following electromagnetic properties:

a magnetic moment value of about 16,000 to 24,000 Gauss, and preferably of about 18,000 to 20,000 Gauss, an anisotropy value of about 11 to 20 Oe and preferably of about 15 to 18 Oe, a coercivity value of about $\leq 1.5$ Oe and preferably of less than 1 Oe, and most preferably of about 0.1 to 0.8 Oe, and a magnetostriction value of about $+10^{-4}$ to $-10^{-4}$, and preferably of about $+10^{-5}$ to $-10^{-5}$.

The electromagnetic properties described above are determined by commonly accepted practices.

To the knowledge of the present inventors, no one has heretofore provided any magnetic thin films of Co, Fe, and other elements having any of the following electromagnetic properties, individually or in combination, which are provided by the alloys and films of the present invention: a magnetic moment of about 16,000 to 24,000 Gauss, a coercivity value of less than 1 Oe and an anisotrophy value of about 11 to 20.

When the magnetic thin films of the present invention are used in magnetic recording heads, the heads may be made with pole tips which are only about 0.1 or 5.0 microns in thickness.

Preparation of Alloys and Films

The CoFeCu alloys of the present invention are prepared from a single novel aqueous plating solution using a DC or pulsed current electro-deposition process. The alloys are preferably prepared from such solutions in the form of thin films or thin film laminates with the non-magnetic laminae described above.

The Co, Fe and Cu ions are supplied to the plating solution or bath in the form, preferably, of soluble sulfates, acetates, sulfonates, tartrates, citrates, or any other suitable ionic form.

In addition to the Co, Fe and Cu ions, the plating baths or solutions of the present invention would contain one or more water soluble buffering agents such as acetates, citrates, tartrates, sulfonates, malonates, or similar agents wherein the cations in the buffering agents would preferably be Na or K, one or more water soluble surfactants such as FC-95, Triton X-100, sodium lauryl sulfate, or any similar surfactant, one or more water soluble stress reducers such as the water soluble salts of saccharin or similar materials, and one or more water soluble conducting salts such as sodium sulfate, or similar salts.

The bath compositions would vary as follows:

| Component of Bath | Concentration of Components | |
|---|---|---|
| | General Range | Preferred Range |
| CO 2+ | 0.05 to 0.7M | 0.1 to 0.3M |
| Fe 2+ | 0.005 to 0.05M | 0.01 to 0.03M |
| Cu 2+ | 0.0005 to 0.005M | 0.0007 to 0.003M |
| Buffer | 0.005 to 0.5M | 0.05 to 0.2M |
| Stress Reducer | 0.05 to 5 g/l | 1 to 3 g/l |
| Surfactant | 5 to 50 ppm | 5 to 20 ppm |
| Conducting Salt | 10 to 50 g/l | 25 g/l |

M = molarity
g/l = grams per liter
ppm = parts per million

The plating baths have a pH in the range of about 2 to 5 and preferably of about 2.5 to 4. Sulfuric acid may be used to provide the desired pH value.

The water used in the baths is preferably distilled or deionized water.

The electrodeposition process is preferably conducted at room temperature, of about 20°–30° C., and at a current density at the cathode of about 4 to 50 mA/cm². The cathode used is, preferably, a $Ni_{80}Fe_{20}$ seeded dielectric substrate. The anode used is preferably Co.

Due to the fact that the Cu deposition reaction at the cathode is favored, thermodynamically, to the Co and Fe deposition reactions, the Cu content of the resulting deposited alloy composition depends strongly on agitation of the bath as well as on the $Cu^{2+}$ concentration in the solution and on current density. The electrolyte baths of the present invention are thus best suited for use in plating processes carried out in paddle equipped electrolysis cells which provide uniform agitation over large area surfaces, typically about 8×8 in² or much larger (see U.S. Pat. No. 4,102,756—Castellani et al.). Such paddle cell agitation is equivalent to 200 to 700 rpm of a rotating disk electrode when the frequency of the paddle motion is about 1 Hz. Plating of alloys with uniform composition and thickness can also be done in other types of plating cells capable of providing similar levels of uniform agitation. Non-uniform agitation would result in films with non-uniform composition and while not desired for magnetic devices may be desirable for other purposes.

During deposition an external magnetic field is continuously applied across the plating cell at a level of about 100 to 10,000 Gauss, and preferably 500 to 3500 Gauss.

The same plating solution, as described above, which is used for CoFeCu plating can also be used, according to the present invention, for making laminated films from alternating layers of magnetic film and non-magnetic film. The magnetic film layer would consist of a layer of the CoFeCu alloy of the present invention and the non-magnetic layer would be one of pure Cu or a CoCu alloy in which the amount of Co is less than about 5 weight percent. These CoFeCu—Cu or CoFeCu—CoCu laminates can be made by pulsing the plating current between two values: $i_{hi}$ and $i_{lo}$. These values represent, respectively, low Cu and high Cu alloy layers.

During the passage of current at the $i_{hi}$ value, the CoFeCu magnetic alloy of the present invention is plated out. The magnitude of $i_{hi}$ depends on the desired composition of the magnetic alloy, the composition of the bath and the strength of the agitation employed.

Thus, raising the value of $i_{hi}$ at a fixed agitation favors increasing the concentration of the Co and the Fe in the alloy, increasing the concentration, respectively, of the Co, Fe and Cu ions favors increasing the respective element content in the alloy, and increasing the strength of the agitation favors increasing the content of Cu in the alloy.

During the passage of the current at the $i_{lo}$ value, the non-magnetic Cu or CoCu layer is plated out. The magnitude of the $i_{lo}$ value should preferably be lower than the diffusion limited two-electron reduction current density of $Cu^{2+}$ and is therefore a function of $Cu^{2+}$ concentration and agitation. Typically, a 0.5 mA/cm² plating current will generate an electrodeposited layer of nearly pure Cu and a 0.7 to 1.0 mA/cm² plating current will generate an electrodeposited layer of the low Co content, non-magnetic, CoCu alloys from the electrolyte baths of the present invention at 1 Hz paddle frequency and 0.0007 Molar $Cu^{+2}$ concentration (mA=milliampere).

The length of each current pulse is about 20 to 400 seconds for magnetic layers at 4 to 50 mA/cm², and about 10 to 800 seconds for the non-magnetic layers of 0.5 to 1.0 mA/cm² and 1 Hz paddle frequency.

The number of layers produced in the laminate will be defined by the number of pulse pairs applied, with the understanding that for the purposes of the present invention, both of the outermost layers in each laminate must be magnetic. The thickness of each layer is defined by the magnitude of the current employed, the length of the pulse and the current efficiency during the deposition of the layer. Thus, increasing the magnitude of the current favors increasing the film thickness while at the same time decreasing the Cu content of the film, and increasing the length of the pulse favors increasing the thickness of the layer while maintaining the Cu content of the film constant.

Typically, the current efficiency at the cathode for obtaining the magnetic layer of the present invention from the plating baths described above is about 70%. The current efficiency for the deposition of the non-magnetic layer is about 30% to 50%, and increases with an increasing $i_{lo}$ value. For the best results, each non-magnetic layer depositing pulse is preceded by an anodic pulse of duration of about 1 to 2 seconds and magnitude of about 0.5 mA/cm².

As the electrodeposition process proceeds, the composition of the bath is monitored and depleted ions are replenished.

The novel current pulsing method described above for alternately plating magnetic and non-magnetic ternary alloy layers out of the same electroplating bath may be used to plate other laminates such as 5% Cu—95% NiFe (magnetic)/95% Cu—5% NiFe (non-magnetic). See for example, Romankiw et al., Electroplated Laminated Cu—Ni—Fe Films From A Single Plating For Inductive Recording Heads And Magnetic Shields, Extended Abstracts of the Electrochemical Society ABS #300, Vol. 89, p. 430 (1989), incorporated herein by reference.

DESCRIPTION OF THE DRAWINGS

Figure 2:
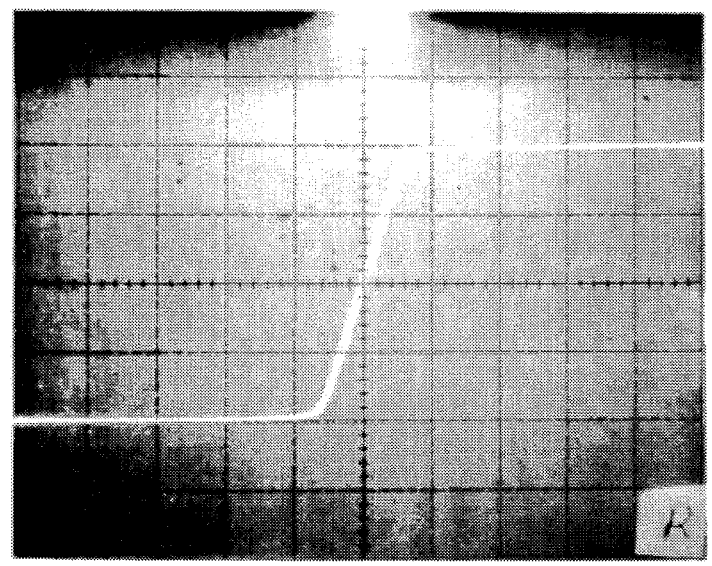
Figure 3:
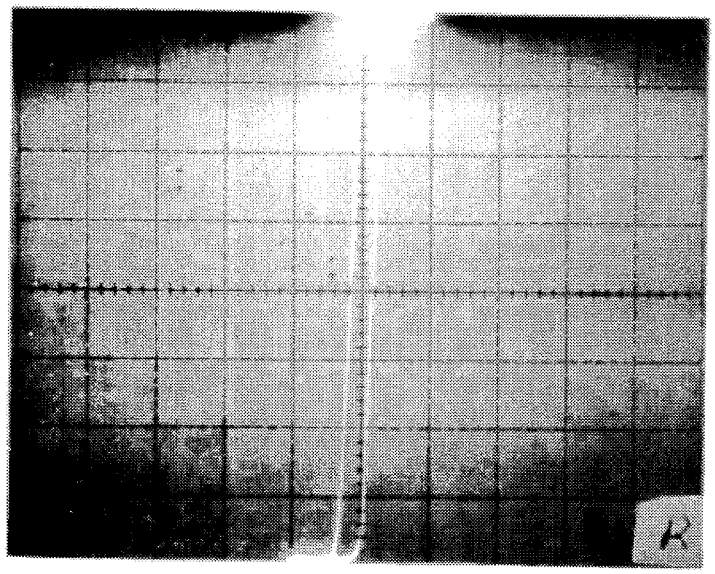
FIGS. 3 and 4 show B-H loops in the easy and hard axes, respectively, of a 2 μm $Co_{86}Fe_{11}Cu_3$ film.
Figure 4:
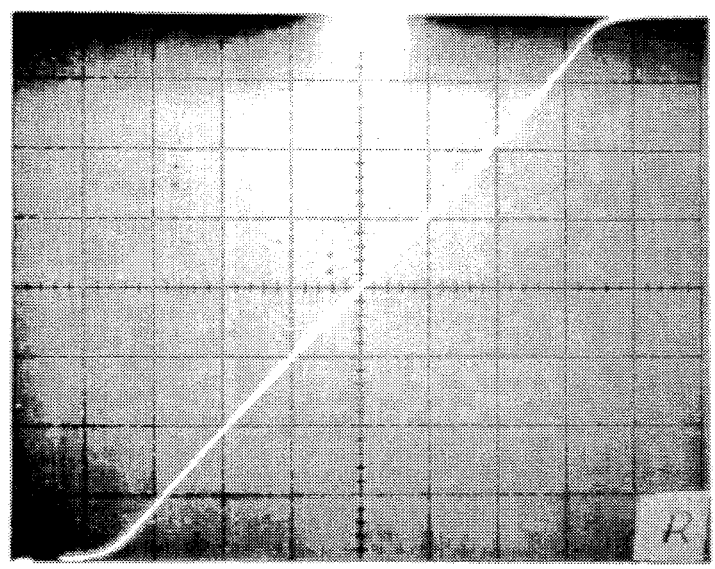

In FIGS. 1 to 4, the B-H loops of a plated $Co_{86}Fe_{11}Cu_3$ magnetic film of the present invention are compared to the corresponding B-H loops of a plated $Ni_{82}Fe_{18}$ film of identical thickness (=2 μm). FIG. 1 shows the easy axis B-H loop and FIG. 2 shows the hard axis B-H loop for the $Ni_{82}Fe_{18}$ film. FIG. 3 shows the easy axis B-H loop and FIG. 4 shows the hard axis B-H loop for the $Co_{86}Fe_{11}Cu_3$ film. The driving fields used in deriving such loops were 4 Oe and 20 Oe for easy axis loops and hard axis loops, respectively. The magnetic moment values of the $Co_{86}Fe_{11}Cu_3$ film is two times higher than the magnetic moment of the $Ni_{82}Fe_{18}$ film. The coercivity of a 2 μm $Co_{86}Fe_{11}Cu_3$ film is 0.64 Oe which compares favorably to that of the 2 μm $NiB_2Fe_{18}$ film (=0.46 Oe). Finally, the anisotropy value ($H_k$) for the $Co_{86}Fe_{11}Cu_3$ film is 14 Oe which is considerably higher than the $H_k$ value of the $Ni_{82}Fe_{18}$ film (=3 Oe).

Figure 5:
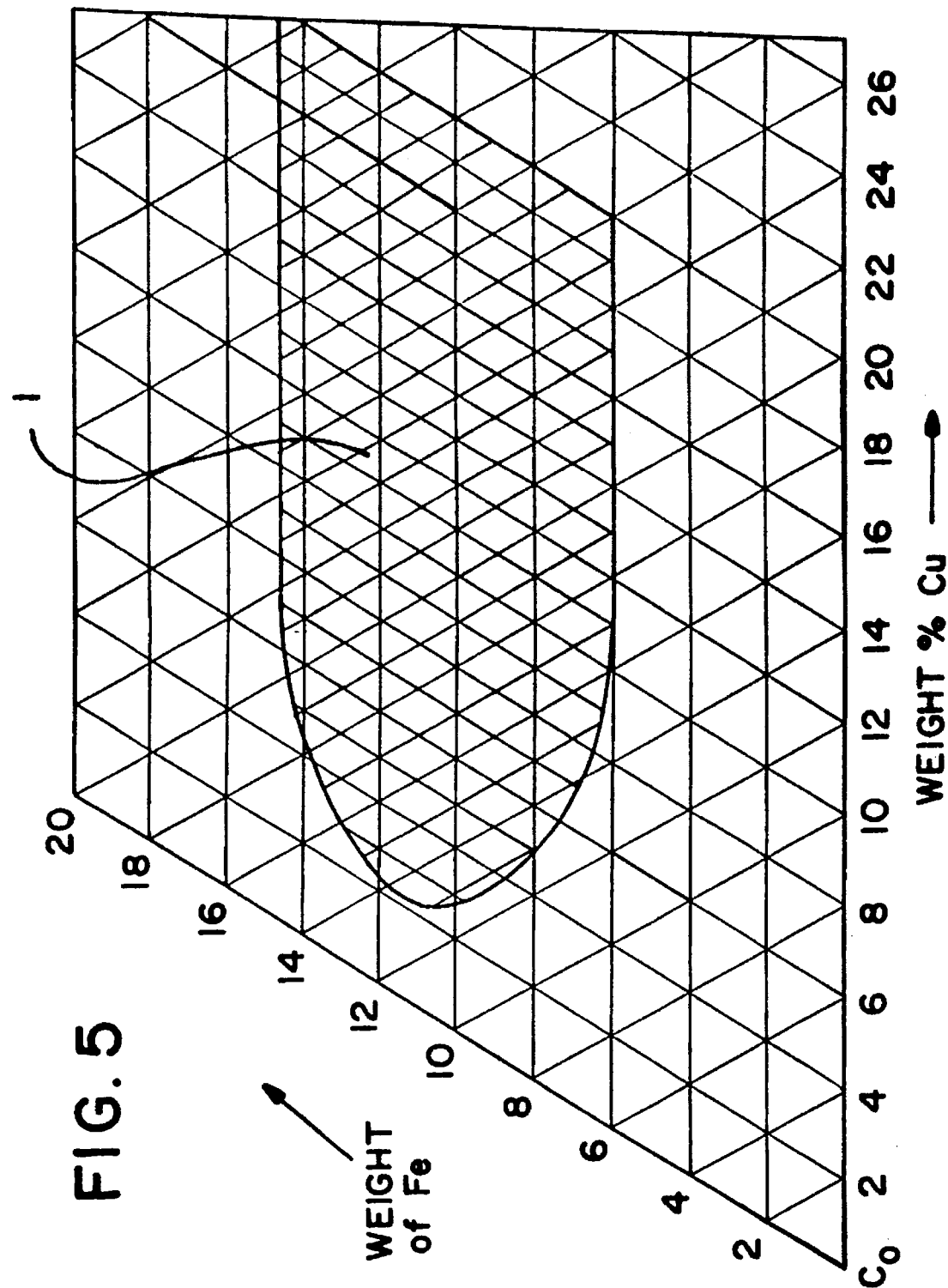
FIG. 5 shows a graph which discloses the scope of the composition of the CoFeCu alloys of the present invention, in weight % of the respective elements therein.

FIG. 5 is a graph which discloses the full scope of the composition of the CoFeCu alloys of the present invention in weight percent of the respective elements therein. The cross-hatched area 1 of FIG. 5 discloses the actual weight percents of the iron and copper in the alloys of the present invention. The weight percent of cobalt in the FIG. 5 alloys is obtained by difference to 100 weight percent. The cross-hatched area 1 of the graph shows that region in the CoFeCu compositional diagram in which the magnetic properties of the alloy are best for use in recording heads and shields. Alloys in the region were electroplated from baths as disclosed above. The magnetic properties vary as a function of the composition of the film.

The coercivity value for these CoFeCu films is about 1.5 Oe or less in the region indicated. It is lowest along the composition axis defined by $Co_{86}Fe_{11}Cu_3$—$Co_{79}Fe_{12}Cu_9$—$Co_{73}Fe_{13}Cu_{14}$ and its neighborhood. However, coercivity becomes considerably greater than 1.5 Oe for CoFeCu films with compositions outside the region. For instance, the coercivity of a $Co_{71}Fe_4Cu_{25}$ film is 2.65 Oe.

Anisotropy values increase with the Cu content of the CoFeCu film. Anisotropy values higher than 11 Oe can be achieved in the alloys of the present invention by Cu enrichment of the CoFeCu alloy. Thus, the anisotropy for films in the 3 to 6 weight percent Cu range is 13–14 Oe, and increases to about 16 to 20 Oe for films with about 14 to 20 weight % Cu.

The magnetic moment of the CoFeCu films with compositions in the region indicated in FIG. 2 decreases with increasing Cu content and increases with Fe content. Thus, the magnetic moment of alloys with compositions in the left side of the region (Cu content less than 8 weight % and Fe content between about 6 and 15 weight %) is about 18,000–24,000 Gauss; alloys with compositions in the bottom right region (Cu content of about 17–20 weight % and Fe Content of about 6–8 weight %) have a magnetic moment of about 16,000–18,000 Gauss; and alloys with compositions in the upper right region (Cu content of about 17–20 weight % and Fe content of about 11–15 weight %) have a magnetic moment of about 18,000–20,000 Gauss.

The magnetostriction coefficient of CoFeCu films along the composition axis of low coercivity described above is very close to 0. It is negative for films with less than about 9 weight % Fe, and decreases with increasing Cu content. The magnetostriction coefficient is positive for films with more than about 11 weight % Fe and increases with increasing Cu content.

Thus, based on these data, it can be seen that the low Cu content CoFeCu alloys of the present invention have a unique set of electromagnetic properties, which to the inventors' knowledge are the best set of properties currently available in thin film alloys useful in recording heads, shields, and flux guides. These alloys provide a combination of a low coercivity value, a high magnetic moment value, a relatively high anisotropy value, and a close-to-zero magnetostriction coefficient.

Figure 6:
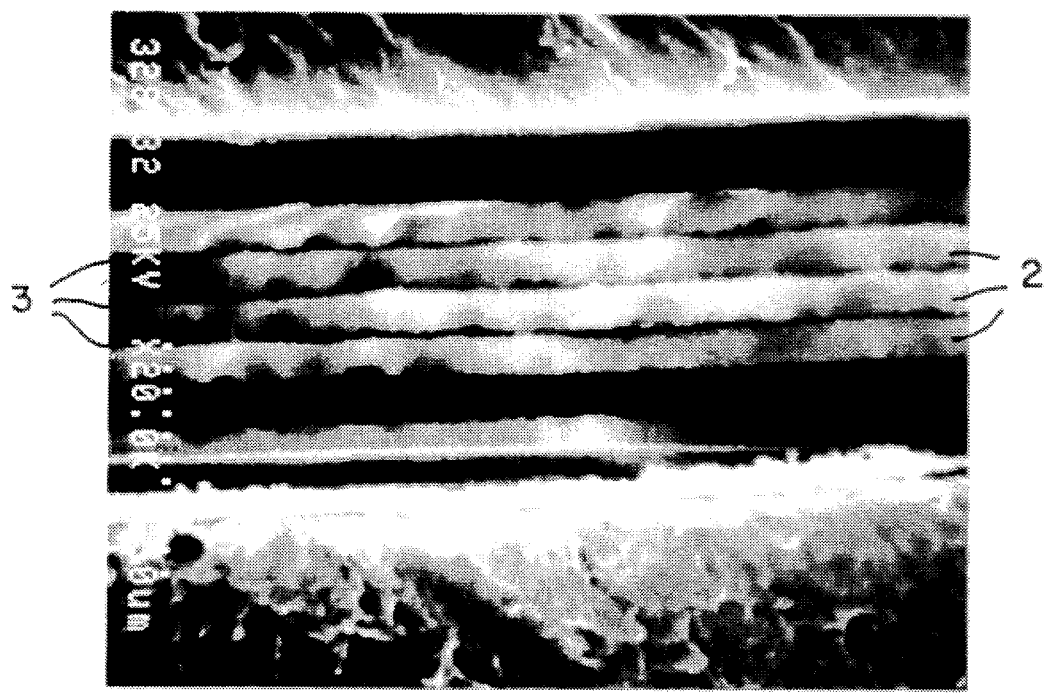
FIG. 6 is an electron micrograph picture of a laminate film of the present invention.

Laminates of Cu with the CoFeCu alloys of the present invention have also been prepared, using the pulsed current modulation process described above. Evidence that the process produces the laminates described above is shown in FIG. 6. FIG. 6 shows an electron micrograph picture of a cross-section of a $Co_{86}Fe_{11}Cu_3$—Cu laminate made by the process of the present invention. The laminated film shown in FIG. 6 consists of six 3000 Å thick $C_{86}Fe_{11}Cu_3$ layers 2 separated by five 25 A thick Cu layers 3. The cross-section shown has been magnified 20,000 times relative to the actual cross-section of the film.

While the invention has been particularly shown and described with respect to the preferred embodiments thereof, it should be understood by those skilled in the art that the foregoing and other changes in form and detail may be made therein without departing from the spirit and scope of the invention which should be limited only by the scope of the appended claims.

Having thus described our invention, what we claim as new, and desire to secure by Letters Patent, is:

1. A laminate comprising a magnetic thin film alloy of Co, Fe and Cu laminated to a non-magnetic film wherein the magnetic thin film alloy is an alloy comprising:

wherein x, y, and z represent, respectively, the weight % of Co, Fe and Cu in said alloy; and x=about 65 to 92, y=about 6 to 15, and z=about 2 to 20.

2. The laminate of claim 1 wherein the magnetic thin film alloy is an alloy of cobalt, iron and copper having the weight percent composition therefor shown in the cross-hatched area of FIG. 5 of the drawings, wherein the weight percents of said iron and copper are actually disclosed in said cross-hatched area, and the weight percent of said cobalt is obtained by difference, to 100 weight percent.

3. The laminate of claim 1 wherein x=about 73 to 86 y=about 11 to 13 z=about 3 to 14.

4. The laminate of claim 1 wherein the magnetic thin film alloy is an alloy of Co, Fe and Cu having a magnetic moment value of about 16,000 to 24,000 Gauss.

5. The laminate of claim 1 or 6 wherein the magnetic thin film alloy is an alloy of Co, Fe and Cu having an anisotropy value of about 11 to 20 Oe.

6. The laminate of claim 1 wherein the magnetic thin film alloy is an alloy of Co, Fe and Cu having a coercivity value of less than 1 Oe.

7. The laminate of claim 1 wherein the magnetic thin film alloy is an alloy of Co, Fe and Cu having a magnetostriction value of about $+10^{-4}$ to $-10^{-4}$.

8. The laminate of claim 1 wherein the magnetic thin film alloy is $Co_{86} Fe_{11} Cu_3$.

9. The laminate of claim 1 wherein the magnetic thin film alloy is $Co_{79} Fe_{12} Cu_9$.

10. The laminate of claim 1 wherein the magnetic thin film alloy is $Co_{73} Fe_{13} Cu_{14}$.

11. A magnetic recording head comprising a laminate of claim 1.

12. A magnetic shield comprising a laminate of claim 1.

13. A magnetic thin film comprising a plurality of thin films of an alloy of cobalt, iron and copper having the formula $Co_xFe_yCu_z$, wherein x, y and z represent, respectively, the weight % of Co, Fe, and Cu in said alloy, and x=about 65 to 92, y=about 6 to 14, and z=about 2 to about 20, and wherein said magnetic films are separated by alternating non-magnetic thin films.

14. A magnetic thin film as in claim 13 wherein said non-magnetic film is Cu or CuCo.

15. A magnetic recording head comprising a magnetic thin film of claim 13.

16. A magnetic shield comprising a magnetic thin film of claim 13.

17. The magnetic thin film of claim 13 or 14 wherein the alloy is $Co_{86} Fe_{11} Cu_3$.

18. The magnetic thin film of claim 13 or 14 wherein the alloy is $Co_{79} Fe_{12} Cu_9$.

19. The magnetic thin film of claim 13 or 14 wherein the alloy is $Co_{73} Fe_{13} Cu_{14}$.

20. A magnetic recording head comprising a magnetic thin film of claim 14.

21. A magnetic shield comprising a magnetic thin film of claim 14.

22. A magnetic recording head according to claim 15 having poletips which are about 0.1 to 5.0 microns in thickness.

23. A magnetic recording head comprising a magnetic thin film wherein said film comprises an alloy of cobalt, iron and copper having the formula $Co_xFe_yCu_z$, wherein x, y, and z represent, respectively, the weight % of Co, Fe and Cu in said alloy, and x=about 65 to 92, y=about 6 to 15, and z=about 2 to 20.

24. The magnetic recording head of claim 23 wherein said film is an alloy of Co, Fe and Cu having a magnetic moment value of about 16,000 to 24,000 Gauss, an anisotropy value of about 11 to 20 Oe and a coercivity value of less than 1 Oe.

25. The magnetic recording head of claim 24 wherein said film is an alloy of Co, Fe and Cu having a magnetostriction value of about $+10^{-4}$ to $-10^{-4}$.

26. A magnetic shield comprising a magnetic thin film alloy of cobalt, iron and copper having the formula $Co_xFe_y$-

$Cu_z$, wherein x, y and z represent respectively, the weight % of Co, Fe and Cu in said alloy, and=about 65 to 92, y=about 6 to 14 and z=about 2 to about 20.

27. The magnetic shield of claim 26 wherein said film is an alloy of Co, Fe and Cu having a magnetic moment value of about 16,000 to 24,000 Gauss, an anisotropy value of about 11 to 20 Oe and a coercivity value of less than 1 Oe.

28. The magnetic shield of claim 27 wherein said film is an alloy of Co, Fe and Cu having a magnetostriction value of about $+10^{-4}$ to $-10^{-4}$.

29. A method of electro-depositing a laminated film of alternate layers of at least one magnetic layer and at least one non-magnetic layer comprising:

alternately electroplating a magnetic layer comprised of a ternary alloy having the formula $Co_xFe_yCu_z$; wherein x, y and z represent, respectively, the weight % of Co, Fe and Cu in said alloy, land x=about 65 to 92, y=about 6 to 14, and z=about 2 to about 20, and a non-magnetic layer comprised of at least one element of said ternary alloy, out of one electroplating bath containing each of the three elements of said ternary alloy.

30. The method of claim 29 wherein the magnetic and non-magnetic layers are electroplated by alternating pulsing a cathode in said bath at a high plating current and a low plating current, respectively.

31. The method of claim 29 wherein the magnetic and non-magnetic layers are electroplated by alternately pulsing a cathode in said bath at a plating current having a long pulse duration and a short pulse duration, respectively.

32. The method of claim 29 wherein the three elements in said bath are Co, Fe and Cu.

33. The method of claim 29 wherein the three elements in said bath are Ni, Fe and Cu.

34. The method of claim 30 where said high plating current pulse has a long pulse duration and said low plating current pulse has a short pulse duration.

35. The method of claim 30 wherein the three elements in said bath are Co, Fe and Cu.

36. The method of claim 30 wherein the three elements in said bath are Ni, Fe and Cu.

37. The method of claim 32 wherein the non-magnetic layer is CoCu.

38. The method of claim 32 wherein the non-magnetic layer is Cu.

39. The method of claim 34 wherein the three elements in said bath are Co, Fe and Cu.

40. The method of claim 34 wherein the three elements in said bath are Ni, Fe and Cu.

41. The method of claim 35 wherein the low plating current is below the Cu diffusion limited current and the high plating current is above the Cu diffusion limited current.

42. The method of claim 36 wherein the low plating current is below the Cu diffusion limited current and the high plating current is above the Cu diffusion limited current.

43. The method of claim 39 wherein the low plating current is below the Cu diffusion limited current and the high plating current is above the Cu diffusion limited current.

44. The method of claim 40 wherein the low plating current is below the Cu diffusion limited current and the high plating current is above the Cu diffusion limited current.

45. A magnetic thin film comprising an alloy of cobalt, iron and copper having the formula $Co_xFe_yCu_z$, wherein x, y and z represent, respectively, the weight % of Co, Fe and Cu in said alloy, and x=about 65 to 92, y=about 6 to 14 and z=about 2 to about 20.

46. The magnetic thin film of claim 45 wherein the alloy is $Co_{86}Fe_{11}Cu_3$.

47. The magnetic thin film of claim 45 wherein the alloy is $Co_{79}Fe_{12}Cu_9$.

48. The magnetic thin film of claim 45 wherein the alloy is $Co_{73}Fe_{13}Cu_{14}$.

49. The magnetic thin film of claim 45 wherein the alloy of Co, Fe and Cu has a magnetic moment value of about 16,000 to 24,000 Gauss.

50. The magnetic thin film of claim 45 wherein the alloy of Co, Fe and Cu has an anisotropy value of about 11 to 20 Oe.

51. The magnetic thin film of claim 45 wherein the alloy of Co, Fe and Cu has a coercivity value of less than 1 Oe.

52. The magnetic thin film of claim 45 wherein the alloy of Co, Fe and Cu has an anisotropy value of about 11 to 20 Oe.

53. The magnetic thin film of claim 45 where the alloy of Co, Fe and Cu has a coercivity value of less than 1 Oe.

54. The magnetic thin film of claim 45 wherein the alloy of Co, Fe and Cu has a magnetostriction value of about $+10^{-4}$ to $-10^{-4}$.

* * * * *

UNITED STATES PATENT AND TRADEMARK OFFICE
CERTIFICATE OF CORRECTION

PATENT NO. : 5,582,927
DATED : December 10, 1996
INVENTOR(S) : P. C. Andricacos, et al.

It is certified that error appears in the above-indentified patent and that said Letters Patent is hereby corrected as shown below:

Column 4, line 39: "CO" should read --Co--

Column 6, line 36: "$NiB_2$" should read --$Ni_{82}$--

Column 7, line 39: "A" should read --$\overset{\circ}{A}$--

Column 9, line 17, Claim 29: "land" should read --and--

Signed and Sealed this

Twenty-third Day of September, 1997

*Attest:*

BRUCE LEHMAN

*Attesting Officer*     Commissioner of Patents and Trademarks